United States Patent
Andreev et al.

(10) Patent No.: US 6,760,896 B2
(45) Date of Patent: Jul. 6, 2004

(54) PROCESS LAYOUT OF BUFFER MODULES IN INTEGRATED CIRCUITS

(75) Inventors: Alexander E. Andreev, San Jose, CA (US); Ivan Pavisic, San Jose, CA (US); Ranko Scepanovic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 13 days.

(21) Appl. No.: 10/254,607

(22) Filed: Sep. 25, 2002

(65) Prior Publication Data

US 2004/0060027 A1 Mar. 25, 2004

(51) Int. Cl.[7] .............................................. G06F 17/50
(52) U.S. Cl. .................. 716/10; 716/12; 716/8
(58) Field of Search ................................. 716/10, 8, 12

(56) References Cited

U.S. PATENT DOCUMENTS 6,110,221 A * 8/2000 Pai et al. ........................ 716/8
6,502,231 B1 * 12/2002 Pang et al. .................... 716/17

OTHER PUBLICATIONS

Tai et al., "Performance Driven Bus Buffer Insertion", Apr. 1996, IEEE Transaction on Computer–Aided Design of Integrated Circuits and Systems, vol. 15 No. 4, pp. 429–437.*

* cited by examiner

Primary Examiner—Vuthe Siek
Assistant Examiner—Brandon Bowers
(74) Attorney, Agent, or Firm—Westman, Champlin & Kelly

(57) ABSTRACT

A bus is defined on a core of an integrated circuit. Routing lines are defined through the core, and net wires are routed through the core along respective routing lines. Buffer columns are defined in the core across a plurality of nets, and buffers are placed in the buffer columns so that an input and output to a respective buffer are on different routing lines. The buffers have at least one free routing line and the net wires are redistribution across the buffer so that (i) the net wire to be buffered is re-routed to the input and output of the buffer, (ii) the net wires on routing lines containing the input and output of the buffer are re-routed to the routing line of the net wire to be buffered and the free routing line, and (iii) all other net wires are routed along their respective routing lines.

14 Claims, 4 Drawing Sheets

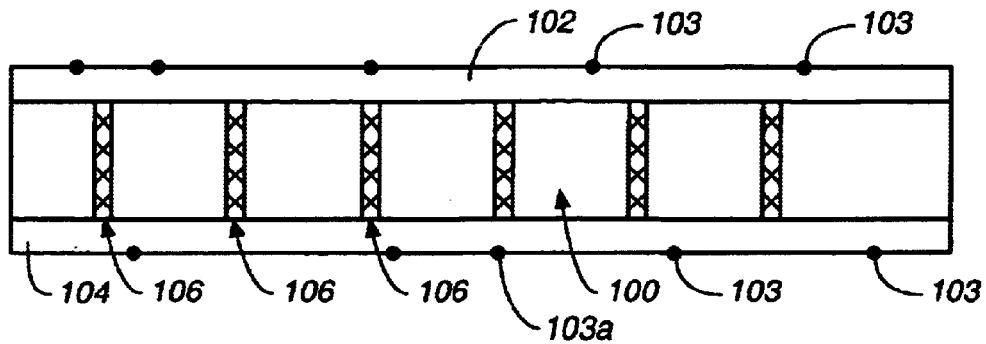
FIG._1
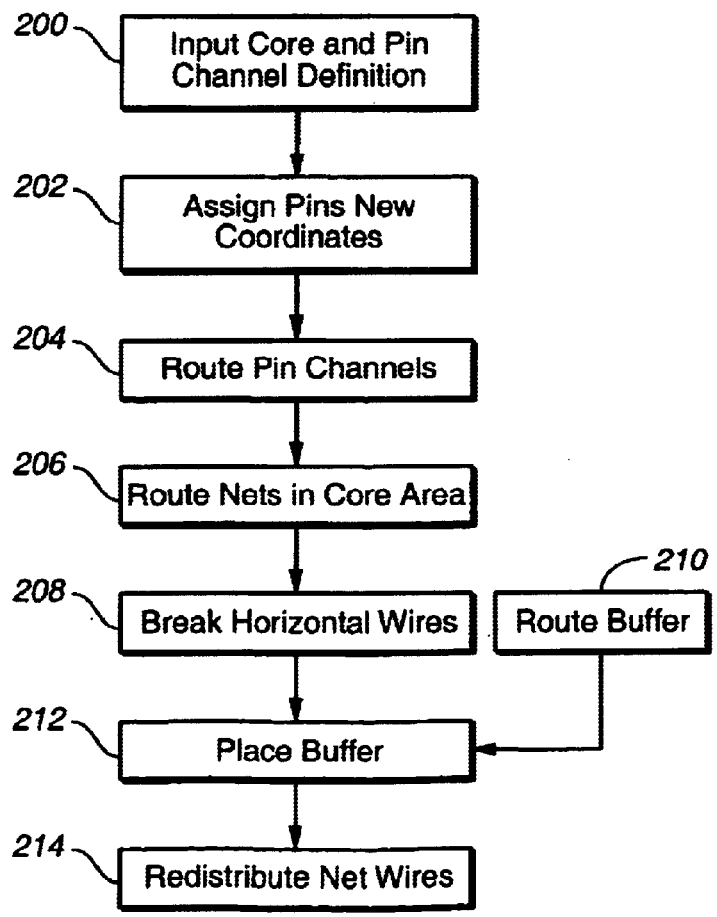
FIG._2

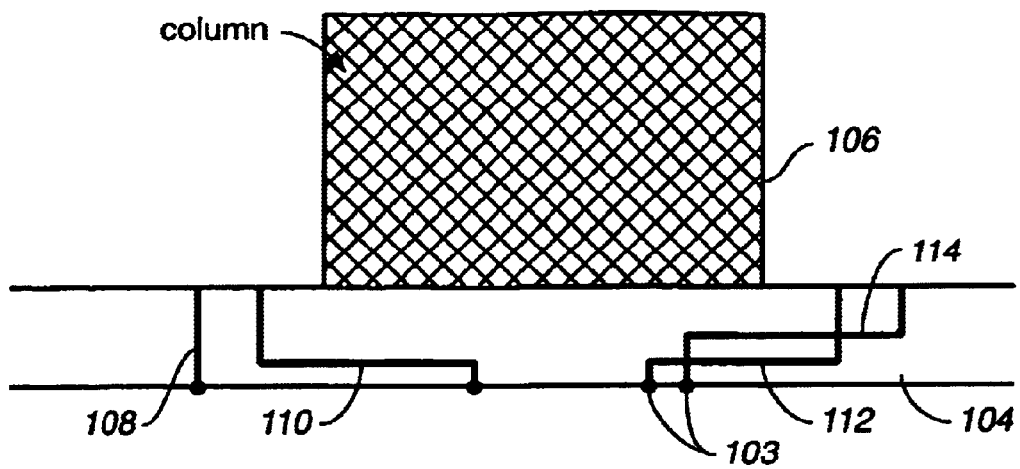
FIG._3
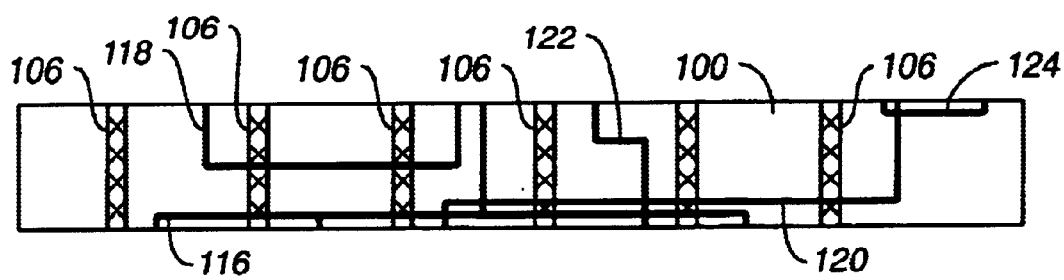
FIG._4
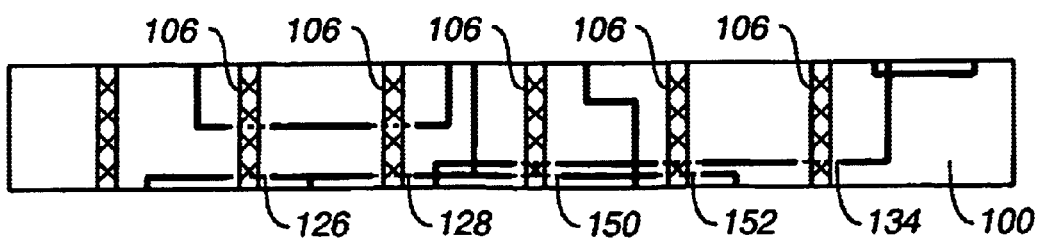
FIG._5

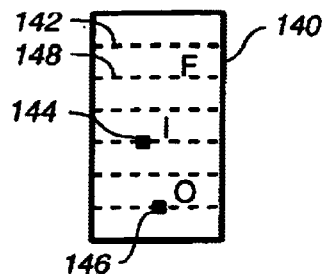
FIG._6
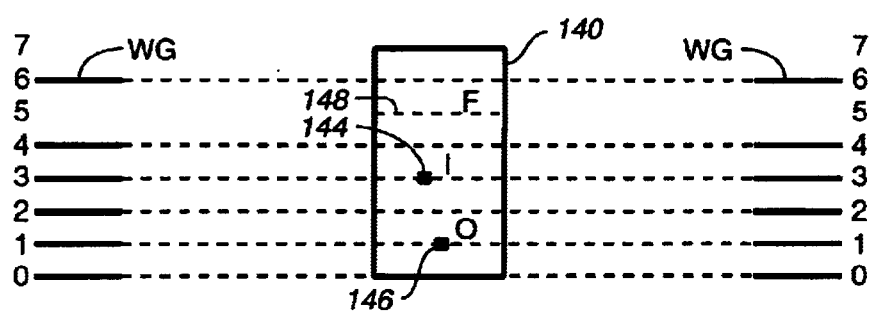
FIG._7
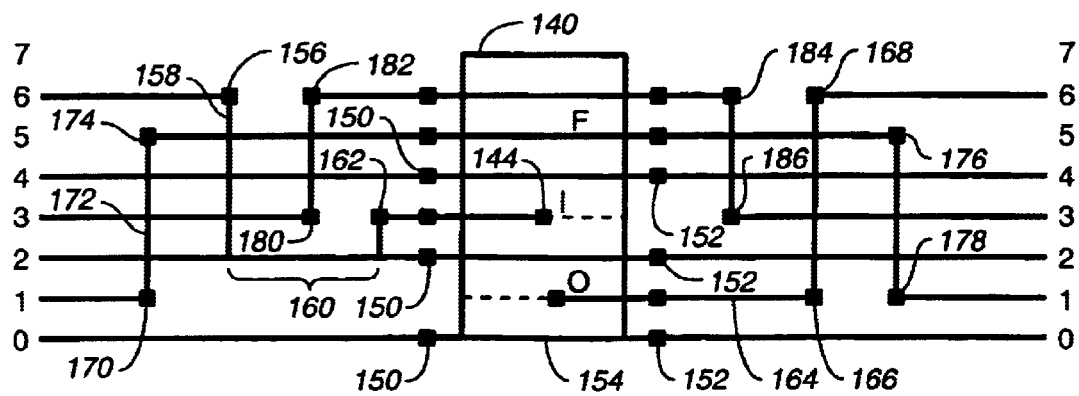
FIG._8

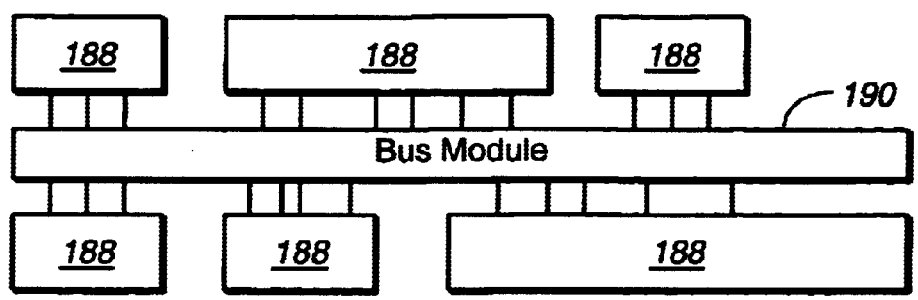
FIG._9
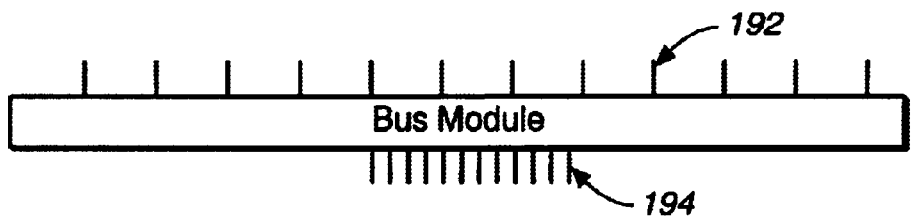
FIG._10

PROCESS LAYOUT OF BUFFER MODULES IN INTEGRATED CIRCUITS

FIELD OF THE INVENTION

This invention concerns integrated circuit layout, and particularly to layout of ICs containing bus modules having repeater buffers.

BACKGROUND OF THE INVENTION

An integrated circuit chip (herein referred to as an "IC" or "chip") comprises cells and connections between cells supported by a substrate. A cell is a group of one or more circuit elements, such as transistors, capacitors and other basic circuit elements, grouped to perform a function. Each cell may have one or more pins, which in turn may be connected to one or more pins of other cells by wires. A net comprises circuitry coupling two or more pins. A typical IC includes a large number of cells and requires complex wire connections between the cells. A typical chip has thousands, tens of thousands and even hundreds of thousands of pins which are connected in various combinations.

Signal buses, composed of plural wires, are formed on the IC to carry multi-bit data and control signals between various circuits on the IC. The Routing wires of the bus are often long, requiring repeater buffers in the wires to preserve signal integrity. Metal layers, separated by layers of insulator material, are configured to define circuit routing wires for connecting various elements of the IC. Usually certain metal layers, such as even-numbered metal layers, are dedicated to horizontal routing wires, and other metal layers, such as odd-numbered metal layers, are dedicated to vertical routing wires. Metal posts or channels between horizontal and vertical routing wires provide connection between them so signals and power can propagate through the IC.

In general the IC layout is defined by rectangular modules having a fixed width and variable height, each containing input and output pins. Each pin is assigned to one of two opposite sides of the module, such as either a bottom or top side, at a given coordinate, such as a horizontal coordinate. One or more output pins are assigned to each input pin and needs to be connected to it. Each input pin, together with all the outputs assigned to it, defines a net.

One continuing problem of IC design is to implement, or route, the nets of a bus using a minimal possible module height. Repeater buffers in the bus ordinarily add to the module height. There is a need for a bus design approach that minimizes the height of the bus, including its repeater buffers.

SUMMARY OF THE INVENTION

In accordance with one embodiment of the invention, a bus is laid out on a core of an integrated circuit with pin channels arranged along at least one edge of the core orthogonal to routing lines through the core. Net wires are routed through the core along respective routing lines. Buffer channels are defined in the core across a plurality of routing lines, and buffers are in the buffer channels so that an input and output to respective buffers are on different routing lines. The net wires are redistributed across the buffers to connect the respective buffer input and output to a net wire to be buffered.

The buffers have at least one free routing line that does not correspond to a net wire. The net wire to be buffered is identified, and the net wires are routed so that (i) the net wire to be buffered is re-routed to the input and output of the buffer, (ii) the net wires on routing lines containing the input and output of the buffer are re-routed to the routing line of the net wire to be buffered and the free routing line, and (iii) all other net wires are routed along their respective routing lines.

In preferred embodiments, the process is carried out in a computer operating under control of a computer program code.

BRIEF DESCRIPTION OF THE DRAWINGS

FIG. 1 is a diagram illustrating a portion of an integrated circuit for receiving a bus in accordance with an embodiment of the invention.

FIG. 2 is a flowchart illustrating the steps of one embodiment of the process of the present invention.

FIGS. 3–8 are diagrams illustrating the execution of the steps of the process illustrated in FIG. 2.

FIGS. 9 and 10 illustrate various applications of the invention to IC buses.

DETAILED DESCRIPTION OF THE PREFERRED EMBODIMENTS

FIG. 1 illustrates the internal physical structure of an IC bus module according to the present invention. A core area 100 separates pin channels 102 and 104 and includes buffer columns 106 that contain buffers. The buffer type and buffer column spacing are chosen based on technology requirements for repeater insertion. The pin channels are horizontally oriented and pins 103 are positioned at coordinates along the horizontal (x) axis.

The placement of the pin channels 102 and 104 at the top and bottom of the module permits reassignment of the position coordinates of pins 103 to avoid areas occupied by columns. It also misaligns the pins so that the routing procedure will converge.

FIG. 2 is a flowchart illustrating the process of laying out bus modules in an IC in accordance with an embodiment of the present invention. At step 200, the core and pin channel definition, including the initial pin coordinates for pins 103, for an IC under design are input to the process, such as to a computer carrying out the process under the control of a computer program code. At step 202, pins 103 are assigned new coordinates such that:

- each new coordinate does not intersect with a buffer column 106,
- no two pins are assigned the same x-coordinate, and
- the distance between the original and newly assigned pin coordinates is minimized.

One process for carrying out step 202 is described in U.S. application Ser. No. 09/833,143 for "Process for Solving Assignment Problems in Integrated Circuit Designs with Unimodal Object Penalty Functions and Linearly Ordered Set of Boxes" by Andreev et al. and assigned to the same assignee as the present invention, the disclosure of which is incorporated herein by reference. In the example of FIG. 1, pin 103a is initially at an x-coordinate that intersects a buffer column 106. Therefore, the process carried out at step 202 moves at least pin 103a to an x-coordinate that does not intersect a buffer.

At step 204, the pin channels are routed to the core using a simple greedy procedure. In this procedure, nets are processed one by one. Each net is assigned a horizontal wire that spans the range between the left-most and right-most pin on the net. The wire is placed on the first available horizontal grid line in the pin channel from the bottom taking into account already placed wires, as well as all design rules related to adjacent via placement. All the pins from the net are then connected to this wire using vertical wires. This procedure determines the height of the pin channel. Vertical wires are routed on the second and fourth metal layers of the IC chip, and horizontal wires are routed using the first and third metal layers. FIG. 3 illustrates a portion of a routed pin channel on the bottom of the module in accordance with the present invention. Routed wires for the nets are shown at 108, 110, 112 and 114. For simplicity of illustration, FIG. 3 shows only the first metal layer for horizontal routing. The horizontal legs of wires 112 and 114 cross the vertical legs of the same wires at different levels of the IC (horizontal legs on the first level and vertical legs on the second level).

At step 206, the net wires 116, 118, 120, 122, 124 are routed in the core area 100 across buffer channels 106 as illustrated in FIG. 4. Again, vertical wires are routed on the second and fourth metal layers and horizontal wires are routed on the first and third metal layers. The nets are routed in core area 100 using the same greedy algorithm as used to route wires in pin channels 104. The actual height of core 100 (as well as of the entire bus module) is determined at this step. At this point, assignment of net wires is performed without "free" buffer grids, explained below.

At step 208, the horizontal net wires on the first and third metal layers are separated and removed from areas of buffer channels 106, as shown in FIG. 5. Removed connections are represented by dotted lines 126, 128, 130, 132, 134.

At step 210, a buffer type is chosen based on the IC design and input and output pins of the buffer are placed on grid lines. More particularly, FIG. 6 illustrates a buffer 140 with the routing grid lines represented by dotted lines 142. Buffer 140 is locally routed so that the input pin 144 and output pin 146 are on two different routing grid lines. Another grid line 148 is chosen and flagged as "Free".

At step 212 buffers 140 are placed in columns 106, starting at the bottom, with buffers spaced at least one grid spacing vertically between them. Thus, if a buffer is N grid lines in height, N−1 grid lines will intersect the buffer (because the "free" grid line was not used for net routing). If a first buffer is placed in a column at the bottom of the module to intersect grid lines 1 to N−1, the next buffer is placed in the column to intersect grid lines N to 2N−1, etc. This way, each horizontal wire in the core intersects no more than one buffer in each column.

FIG. 7 illustrates buffer 140 having input pin 144 output pin 146 and free grid line 148. One of the wires WG on the grid is selected for buffering in columns WG, WG+N, WG+2N, WG+3N, etc. This ensures that the distance between two consecutive repeaters on the same net is N×S, where S is column spacing.

In the example of FIG. 7, if buffer 140 is in column number 22, the signal to be buffered is on wire 6 (22=2N+WG=2×8+6). Assuming that the flow of the signal on wire 6 is from left to right, wire 6 needs to be connected to the buffer input 144 on the left and to the buffer output 146 on the right.

To implement such a connection, at step 214, the wire routing needs to be redistributed on each side of the buffer. There are three different cases, depending on the location of the wire that needs to be buffered (WG), relative to the input pin grid (IG) and the output pin grid (OG). The most complicated redistribution case occurs where WG≠IG and WG≠OG, which is the situation in the example of FIG. 7. In FIG. 7, WG=6, IG=3 and OG=1. The "free" grid line is F=5, meaning there are no net wires initially on grid line 5. Redistribution involves three wires and is illustrated in FIG. 8.

As shown in FIG. 8, all wires except WG, IG, and OG are routed directly, with no vertical jogs (wires 0, 2, 4). Since horizontal wires are on the first layer, they need to be raised to the third layer while crossing buffer 140. (The second layer, normally reserved for vertical wires, can be used since no vertical wires will be used through the buffer channel.) Thus, wires 0, 2 and 4 are jogged vertically at points 150 to the third (or second) metal layer, then cross the buffer channel on a wire 154 on that level to point 152, and jogged back to the first level to complete the horizontal path. Wire 6, which is to be coupled to the buffer's input pin 144 and output pin 146, is jogged at point 156 to the second metal layer to form vertical wire 158 which extends to a point above line 2. The wire continues along a path over wire 2 in the region 160 and vertically to point 162 above wire 3 where it jogs to the second level for connection to input 144 and buffer 140. Wire 6 continues from the output pin 146 at the second metal layer and jogs at point 164 to the first layer of line 1. At point 166, wire 6 jogs vertically on the second or fourth metal layer to point 168 where it jogs to the first layer. Wire 1, on which the buffer's output pin 146 lies, is jogged at point 170 to vertical wire 172 on the second or fourth layer to point 174 on the free line 5 to cross the buffer, and is jogged at point 176 vertically to the wire 1 at point 178 to continue on the first layer. Similarly, wire 3, on which the buffer's input pin 144 lies, is jogged vertically at point 180 to point 182 on line 6 to cross the buffer on the second layer, and is jogged vertically at point 184 to point 186 on wire 3 to continue on the first layer.

In the other two cases, when WG=IG or WG=OG, redistribution is simpler and involves only two wires.

The invention may be employed to connect devices 188 on an IC to a bus 190, as shown in FIG. 9. Another application of the invention is to convert a wide bus 192 to a narrow one 194, as shown in FIG. 10.

In preferred embodiments the process is carried out in a computer using inputs that define the IC module and buffers. Computer program code is provided on a memory, such as a disk or the like, to control the computer processor to execute the program code and perform the process.

Although the present invention has been described with reference to preferred embodiments, workers skilled in the art will recognize that changes may be made in form and detail without departing from the spirit and scope of the invention.

What is claimed is:

1. A process of laying out a bus on a core of an integrated circuit comprising steps of:
    a) defining routing lines through the core;
    b) routing net wires through the core along respective routing lines;
    c) defining buffer columns in the core across a plurality of nets;
    d) placing buffers in the buffer columns so that an input and output to a respective buffer are on different routing lines; and
    e) redistributing net wires across the buffers to connect a respective buffer's input and output to a net wire to be buffered.

2. The process of claim 1, wherein the integrated circuit includes pin channels along an edge of the core orthogonal to the routing lines, and step (a) includes positioning pins in the pin channels at coordinates that do not intersect a buffer column.

3. The process of claim 1, wherein step (c) comprises steps of:
- c1) defining a buffer to occupy N routing lines, and
- c2) routing the buffer so that its input and output are on different routing lines.

4. The process of claim 3, wherein step (d) comprises steps of:
- d1) placing buffers in buffer columns so that a space is between buffers that is at least as great as a space between consecutive routing lines.

5. The process of claim 4, wherein the integrated circuit includes pin channels along an edge of the core orthogonal to the routing lines, and step (a) includes positioning pins in the pin channels at coordinates that do not intersect a buffer column.

6. The process of claim 4, wherein the buffers have at least one free routing line that does not correspond to a net wire, and step (e) comprises steps of:
- e1) identifying a net wire to be buffered,
- e2) routing net wires on each routing line that intersects the buffer so that (i) the net wire to be buffered is re-routed to the input and output of the buffer, (ii) the net wires on routing lines containing the input and output of the buffer are re-routed to the routing line of the net wire to be buffered and the free routing line, and (iii) all other net wires are routed along their respective routing lines.

7. The process of claim 6, wherein the integrated circuit includes pin channels along an edge of the core orthogonal to the routing lines, and step (a) includes positioning pins in the pin channels at coordinates that do not intersect a buffer column.

8. A computer-readable medium storing program code to cause a processor to perform computer-executable process steps for laying out a bus on a core of an integrated circuit, said process steps comprising steps to:
- a) define routing lines through the core;
- b) route net wires through the core along respective routing lines;
- c) define buffer columns in the core across a plurality of nets;
- d) place buffers in the buffer columns so that an input and output to a respective buffer are on different routing lines; and
- e) redistribute net wires across the buffers to connect a respective buffer's input and output to a net wire to be buffered.

9. The computer-readable medium of claim 8, wherein the program code further causes the processor to perform step a) to:
- a1) define pin channels along an edge of the core orthogonal to the routing lines, and
- a2) position pins in the pin channels at coordinates that do not intersect a buffer column.

10. The computer-readable medium of claim 8, wherein the program code further causes the processor to perform step c) to:
- c1) define a buffer to occupy N routing lines, and
- c2) route the buffer so that its input and output are on different routing lines.

11. The computer-readable medium of claim 10, wherein the program code further causes the processor to perform step d) to:
- d1) place buffers in buffer columns so that a space is between buffers that is at least as great as a space between consecutive routing lines.

12. The computer-readable medium of claim 11, wherein the program code further causes the processor to perform step a) to
- a1) define pin channels along an edge of the core orthogonal to the routing lines, and
- a2) position pins in the pin channels at coordinates that do not intersect a buffer column.

13. The computer-readable medium of claim 11, wherein the program code further causes the processor to perform step e) to
- e1) define at least one free routing line in each buffer such that the free routing line does not correspond to a net wire,
- e1) identify a net wire to be buffered, and
- e2) route net wires on each routing line that intersects the buffer so that (i) the net wire to be buffered is re-routed to the input and output of the buffer, (ii) the net wires on routing lines containing the input and output of the buffer are re-routed to the routing line of the net wire to be buffered and the free routing line, and (iii) all other net wires are routed along their respective routing lines.

14. The computer-readable medium of claim 13, wherein the program code further causes the processor to perform step a) to:
- a1) define pin channels along an edge of the core orthogonal to the routing lines, and
- a2) position pins in the pin channels at coordinates that do not intersect a buffer column.

* * * * *